US012626656B2

(12) United States Patent
Li et al.

(10) Patent No.: US 12,626,656 B2
(45) Date of Patent: May 12, 2026

(54) DRIVING METHOD FOR A DISPLAY PANEL AND DISPLAY DEVICE

(71) Applicant: Xiamen Tianma Display Technology Co., Ltd., Xiamen (CN)

(72) Inventors: Dipeng Li, Xiamen (CN); Qi Xiao, Xiamen (CN); Qiang Chen, Xiamen (CN); Ying Sun, Xiamen (CN); Jingxiong Zhou, Xiamen (CN)

(73) Assignee: Xiamen Tianma Display Technology Co., Ltd., Xiamen (CN)

( * ) Notice: Subject to any disclaimer, the term of this patent is extended or adjusted under 35 U.S.C. 154(b) by 10 days.

(21) Appl. No.: 18/795,909

(22) Filed: Aug. 6, 2024

(65) Prior Publication Data

US 2024/0395209 A1     Nov. 28, 2024

(30) Foreign Application Priority Data

Oct. 8, 2023     (CN) ......................... 202311290428.X

(51) Int. Cl.
*G09G 3/3233*          (2016.01)
*H10K 59/131*          (2023.01)

(52) U.S. Cl.
CPC ......... *G09G 3/3233* (2013.01); *H10K 59/131* (2023.02); *G09G 2300/0819* (2013.01); *G09G 2300/0842* (2013.01); *G09G 2300/0861* (2013.01); *G09G 2310/08* (2013.01); *G09G 2320/0247* (2013.01); *G09G 2320/045* (2013.01); *G09G 2330/02* (2013.01); *G09G 2340/0435* (2013.01)

(58) Field of Classification Search
CPC ................... G09G 3/30; G09G 3/3233; G09G 2300/0819; G09G 2300/0842; G09G 2300/0861; G09G 2310/08; G09G 2320/0247; G09G 2320/045; G09G 2330/02; G09G 2330/04; G09G 2340/0435; H10K 59/131
See application file for complete search history.

(56) References Cited

U.S. PATENT DOCUMENTS

2014/0292627 A1* 10/2014 Pyun ..................... G09G 3/3614
                                                                        345/96
2023/0157069 A1*  5/2023 Ma ......................... H10K 59/124
                                                                        257/40

* cited by examiner

*Primary Examiner* — Stacy Khoo
(74) *Attorney, Agent, or Firm* — KDW FIRM PLLC

(57)          ABSTRACT

A driving process of the display panel includes a first stage, a display stage, and a second stage. The driving method of the display panel includes the following steps. A first voltage is started to be provided to the metal pattern at the first time in the first stage, where the first voltage is greater than 0. A first black-state voltage is started to be provided to the data line at the second time in the first stage. A second voltage is stopped to be provided to the metal pattern at the third time in the second stage, where the second voltage is greater than 0. A second black-state voltage is stopped to be provided to the data line at the fourth time in the second stage. The first time is before the second time, and/or the third time is after the fourth time.

20 Claims, 8 Drawing Sheets

DRIVING METHOD FOR A DISPLAY PANEL AND DISPLAY DEVICE

CROSS-REFERENCE TO RELATED APPLICATION(S)

This application claims the priority of a Chinese Patent Application No. 202311290428.X, filed on Oct. 8, 2023, the disclosure of which is incorporated herein by reference in its entirety.

TECHNICAL FIELD

The present application relates to the field of display technology, in particular, a driving method for a display panel and a display device.

BACKGROUND

With the continuous development of display technology, users have increasingly higher requirements for the performance of display panels in all aspects.

Pixel circuits may be configured in a display panel to drive a light-emitting element for display. A pixel circuit includes multiple transistors that can be used for, for example, writing data and generating drive currents.

However, transistors in the pixel circuit are prone to leakage. As a result, screen flickering is likely to occur in the process of powering on and off of the display panel, affecting the user experience.

SUMMARY

Embodiments of the present application provide a driving method for a display panel and a display device.

In a first aspect, embodiments of the present application provide a driving method for a display panel. The display panel includes a substrate, a metal pattern, a pixel circuit, and a light-emitting element. In the direction of the thickness of the display panel, the metal pattern is disposed between the substrate and the pixel circuit, the metal pattern overlaps an orthographic projection of a channel of at least a portion of transistors in the pixel circuit on the substrate, and the pixel circuit is electrically connected to a data line. The driving process of the display panel includes a first stage, a display stage, and a second stage. The display stage is between the first stage and the second stage.

The driving method includes the steps described below.

A first voltage is started to be provided to the metal pattern at the first time in the first stage, where the first voltage is greater than 0. A first black-state voltage is started to be provided to the data line at the second time in the first stage. A second voltage is stopped to be provided to the metal pattern at the third time in the second stage, where the second voltage is greater than 0. A second black-state voltage is stopped to be provided to the data line at the fourth time in the second stage. The first time is before the second time, and/or the third time is after the fourth time.

In a second aspect, embodiments of the present application provide a display device. The display device includes a display panel, a power drive chip, and a display drive chip.

The display panel includes a substrate, a metal pattern, a pixel circuit, and a light-emitting element. In the direction of the thickness of the display panel, the metal pattern is disposed between the substrate and the pixel circuit, the metal pattern overlaps an orthographic projection of a channel of at least a portion of transistors in the pixel circuit on the substrate, and the pixel circuit is electrically connected to a data line.

The driving process of the display panel includes a first stage, a display stage, and a second stage. The display stage is between the first stage and the second stage.

The power drive chip is configured to start providing a first voltage to the metal pattern at the first time in the first stage and stop providing a second voltage to the metal pattern at the third time in the second stage; the first voltage is greater than 0, and the second voltage is greater than 0.

The display drive chip is configured to start providing a first black-state voltage to the data line at the second time in the first stage and stop providing a second black-state voltage to the data line at the fourth time in the second stage.

The display stage of the display panel is between the first stage and the second stage; the first time is before the second time, and/or the third time is after the fourth time.

BRIEF DESCRIPTION OF DRAWINGS

Other features, objects, and advantages of the present application are more apparent after a detailed description of non-limiting embodiments with reference to the drawings below is read. The same or similar reference numerals denote the same or similar features. The drawings are not drawn to actual scale.

REFERENCE LIST

Figure 1:
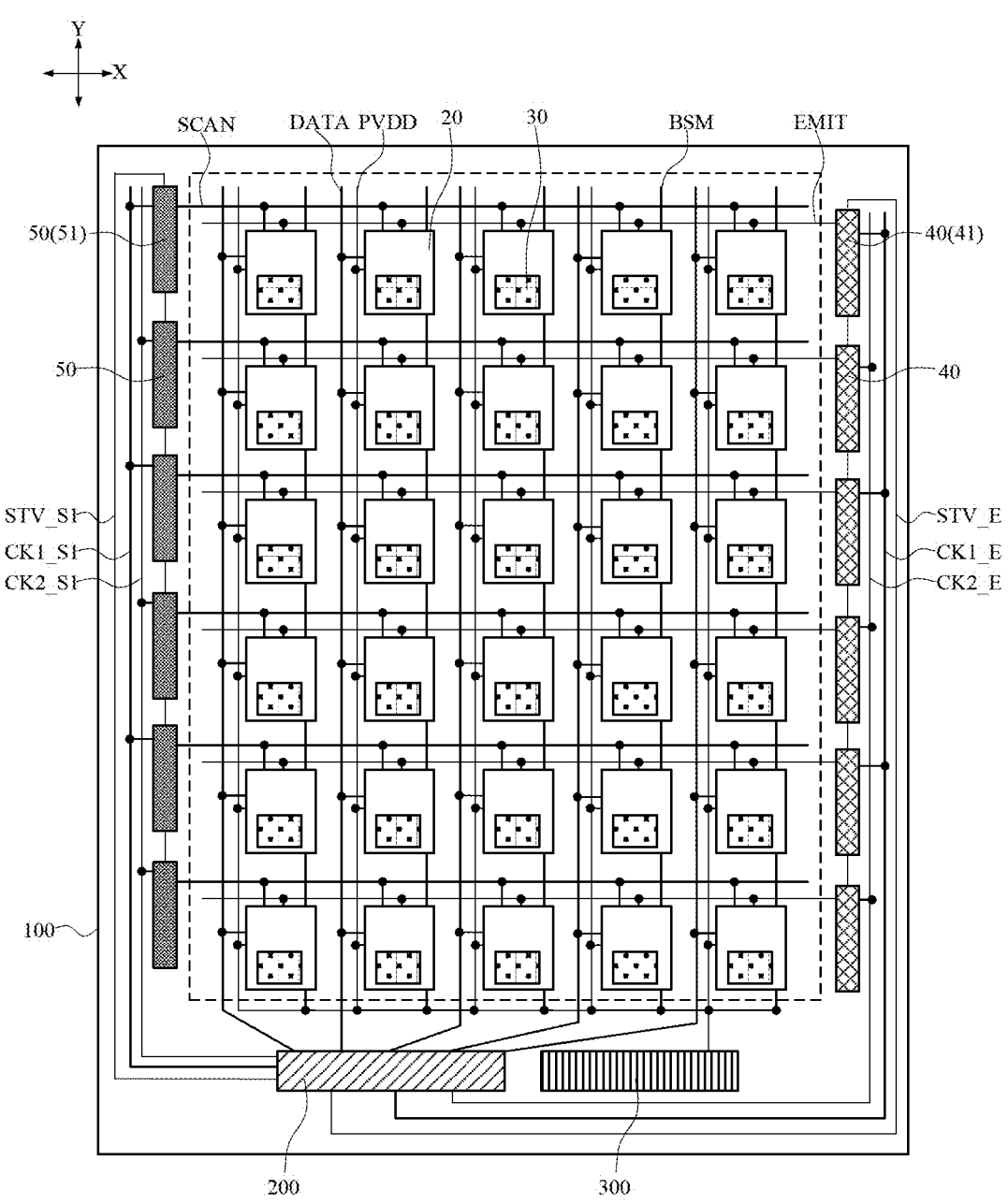
FIG. 1 is a top view illustrating the structure of a display device according to an embodiment of the present application.

100 display panel
   200 display drive chip 300 power drive chip
10 substrate
20 pixel circuit
30 light-emitting element
40 emission shift circuit
41 first emission shift circuit
50 first scan shift circuit
51 first A scan shift circuit
60 second scan shift circuit
61 second A scan shift circuit

DETAILED DESCRIPTION

Features and exemplary embodiments of various aspects of the present application are described in detail below. The present application is described in detail in conjunction with the embodiments and the accompanying drawings, from which the object, technical solutions, and advantages of the present application are more apparent. It is to be understood that the specific embodiments described herein are merely intended to explain and are not to limit the present application. It is apparent to those skilled in the art that the present application may be implemented without some of these specific details. The description of the embodiments below is only to provide a better understanding of the present application by illustration of examples of the present application.

It is to be noted that in the present application, relationship terms such as first and second are used merely to distinguish one entity or operation from another entity or operation and do not necessarily require or imply any such actual relationship or order between these entities or operations. Additionally, the term "comprising", "including", or any other variant thereof is intended to encompass a non-exclusive inclusion so that a process, method, article, or device that includes a series of elements not only includes the expressly listed elements but also includes other elements that are not expressly listed or elements inherent to such a process, method, article, or device. In the absence of more restrictions, the elements defined by the statement "including a . . . " do not exclude the presence of additional identical elements in the process, method, article, or device that includes the elements.

It should be understood that in describing the structure of a component, when one layer or region is referred to as being located "on" or "above" another layer or region, it may indicate that the one layer or region is directly on another layer or region or that other layers or areas are included between the one layer or region and another layer or area. Additionally, if the component is turned over, the one layer or area will be "below" or "under" the another layer or area.

It is to be understood that the term "and/or" in the present application only describes the association relationships of associated objects and indicates that three relationships may exist. For example, A and/or B may indicate three conditions of A alone, both A and B, and B alone. In addition, the character "/" in the present application generally indicates that the front and rear associated objects are in an "or" relationship.

The term "connected" may refer to "electrically connected" or "not electrically connected through an intervening transistor". The term "drive" may refer to "control" or "operate". The term "part" may refer to "partial". The term "pattern" may refer to "member". The term "terminal" may refer to "terminal segment" or "terminal edge". The display panel may be a display device or a module/part of a display device.

It is apparent to those skilled in the art that various modifications and changes in the present application may be made without departing from the spirit or scope of the present application. Accordingly, the present application is intended to cover modifications and variations of the present application that fall within the scope of the appended claims (the claimed technical solutions) and their equivalents. It is to be noted that the embodiments of the present application, if not in collision, may be combined with one another.

Before explaining technical solutions provided by the embodiments of the present application, the present application first specifically explains problems existing in the related technologies to facilitate the understanding of the embodiments of the present application.

The presence of friction static, coupling static, and other electrostatic field environments causes the threshold voltage of a transistor in a pixel circuit to be forwardly biased, and thus the transistor can not be completely turned off in the process of powering on and off, which causes leakage current. As a result, screen flickering is likely to occur in the process of powering on and off of the display panel. For example, the high luminous efficiency of green light-emitting components causes the display panel to easily flash green when powered on and off, affecting the user experience.

To solve the preceding technical problem, embodiments of the present application provide a display panel, a driving method thereof, and a display device. Each embodiment of the display panel, the driving method thereof, and the display device is described below in connection with drawings.

Embodiments of the present application provide a driving method for a display panel. The driving method may be applied to the display device shown in FIG. 1.

Figure 2:
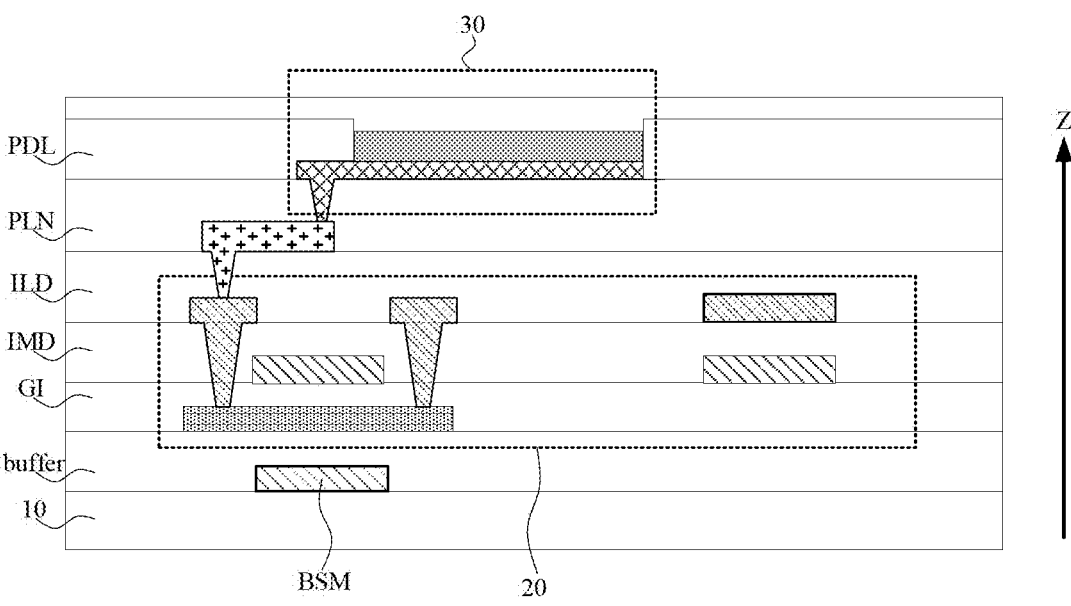
FIG. 2 is a sectional view illustrating the structure of a display panel according to an embodiment of the present application.

With reference to FIGS. 1 and 2, the display device includes a display panel 100, a display drive chip 200, and a power drive chip 300. The display panel 100 includes a substrate 10, metal patterns BSM, pixel circuits 20, and light-emitting elements 30.

As shown in FIG. 1, multiple pixel circuits 20 may be arranged in an array in the first direction X and the second direction Y, and multiple light-emitting elements 30 may also be arranged in an array in the first direction X and the second direction Y. The first direction X and the second direction Y intersect. For example, the first direction X may be a row direction, and the second direction Y may be a column direction.

A pixel circuit 20 is electrically connected to a light-emitting element 30. The pixel circuit 20 may be used for driving the light-emitting element 30 to emit light. The light-emitting element 30 may include an organic light-emitting diode (OLED). Additionally, the pixel circuit 20 is electrically connected to a data line DATA.

As shown in FIG. 2, in the direction Z of the thickness of the display panel 100, the metal pattern BSM is disposed between the substrate 10 and the pixel circuit 20, and the metal pattern BSM overlaps the orthographic projection of a channel of at least a portion of transistors in the pixel circuit 20 on the substrate 10.

Figure 3:
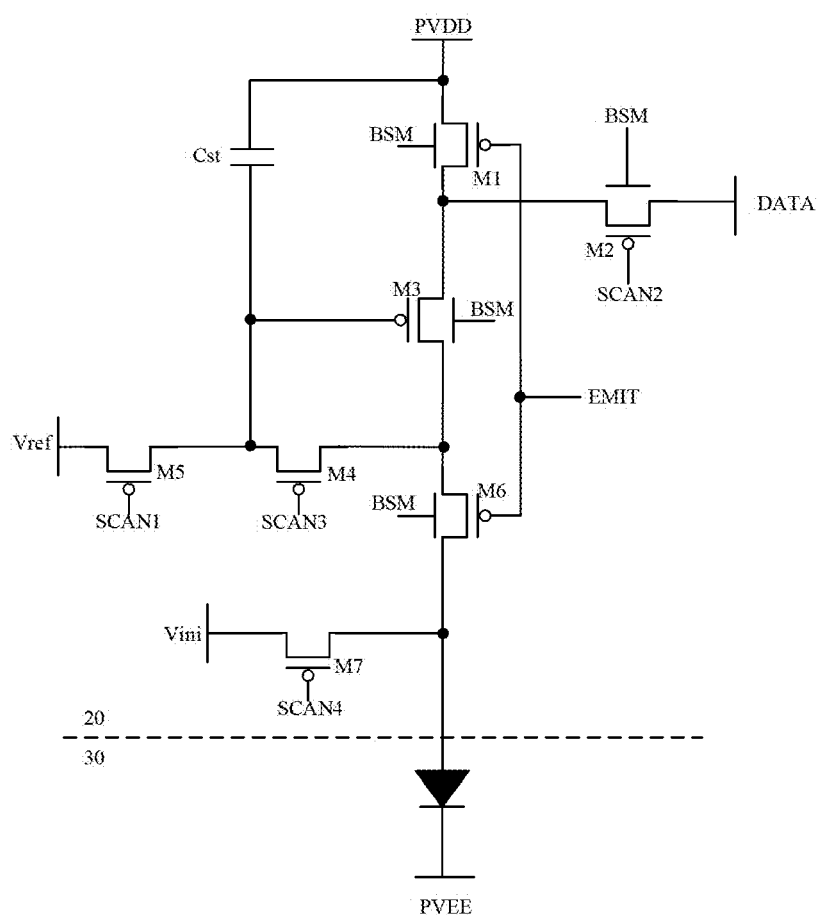
FIG. 3 is a schematic diagram illustrating the circuit structure of a pixel circuit in a display panel according to an embodiment of the present application.

As an example, as shown in FIG. 3, the pixel circuit 20 may include a drive transistor M3 and at least one switch transistor. The drive transistor M3 may be used for generating drive currents to drive the light-emitting element 30 to emit light. The magnitude of the drive current affects the brightness of the light-emitting element 30. The switch transistor may be used for performing a turn-on or turn-off action and may be used for transmitting signals when turned on. For example, the switch transistor includes light emission control transistors M1 and M6, a data writing transistor M2, a threshold compensation transistor M4, a reset transistor M5, and an initialization transistor M7. A first electrode of the data writing transistor M2 is electrically connected to the data line DATA. A second electrode of the data writing transistor M2 is electrically connected to a first electrode of the drive transistor M3.

The metal pattern BSM may overlap the channel of at least one of the drive transistor M3, light emission control transistors M1 and M6, data writing transistor M2, threshold compensation transistor M4, reset transistor M5, and initialization transistor M7.

Figure 4:
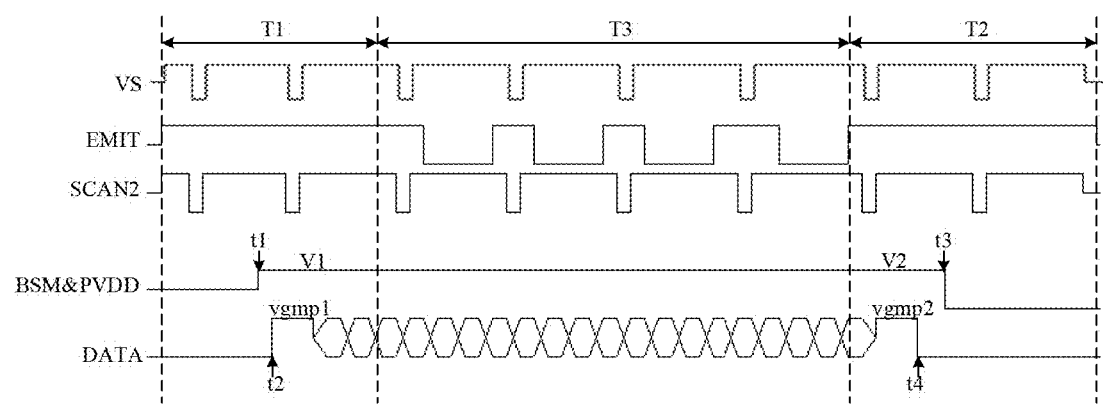
FIG. 4 is a timing diagram of a display panel according to an embodiment of the present application.

As shown in FIG. 4, the driving process of the display panel 100 includes a first stage T1, a display stage T3, and a second stage T2, and the display stage T3 is between the first stage T1 and the second stage T2. The first stage T1 is a power-on stage before the display panel 100 enters normal display. For example, the first stage T1 may be a turn-on stage or a wake-up stage. The second stage T2 is a power-off stage after the display panel 100 ends the normal display. For example, the second stage T2 may be a turn-off stage or a sleep stage.

The driving method of the display panel provided by an embodiment of the present application may include the steps described below. A first voltage V1 is started to be provided to the metal pattern BSM at the first time t1 in the first stage T1, where the first voltage V1 is greater than 0. A first black-state voltage vgmp1 is started to be provided to the data line DATA at the second time t2 in the first stage T1. A second voltage V2 is stopped to be provided to the metal pattern BSM at the third time t3 in the second stage T2, where the second voltage V2 is greater than 0. A second black-state voltage vgmp2 is stopped to be provided to the data line DATA at the fourth time t4 in the second stage T2. The first time t1 is before the second time t2, and/or the third time t3 is after the fourth time t4.

It should be noted that in the first stage T1 and the second stage T2, the display panel 100 is in a black state, and the first black-state voltage vgmp1 and the second black-state voltage vgmp2 are voltages that can cause the display panel 100 to be in a black state.

Additionally, the metal pattern BSM may be in a non-powered state before starting to provide voltage to the metal pattern BSM; the metal pattern BSM may be in a powered state before stopping to provide voltage to the metal pattern BSM; the metal pattern BSM may be in a powered-off state after stopping to provide voltage to the metal pattern BSM. Similarly, the data line DATA may be in a non-powered state before starting to provide voltage to the data line DATA; the data line DATA may be in a powered state before stopping to provide voltage to the data line DATA; the data line DATA may be in a powered-off state after stopping to provide voltage to the data line DATA. Illustratively, when the metal pattern or each signal line mentioned in this embodiment of the present application and the following embodiments is in a non-powered state or a powered-off state, the potential of the metal pattern or each signal line may be equal to the ground potential (GND potential). For example, the GND potential may be 0 V.

The presence of friction static, coupling static, and other electrostatic field environments causes the threshold voltage of a transistor in the pixel circuit to be forwardly biased, and thus the transistor can not be completely turned off in the process of powering on and off. If the data line DATA is powered on before the metal pattern BSM is powered on, or if the data line DATA is powered off after the metal pattern BSM is powered off, the higher black-state voltage on the data line DATA easily flows into the light-emitting element 30, causing the light-emitting element 30 to emit light. As a result, screen flickering is likely to occur in the process of powering on and off of the display panel.

In this embodiment of the present application, for the transistor overlapping the metal pattern BSM, the metal pattern BSM is disposed between the substrate and the channel of the transistor, and the metal pattern BSM can block bottom reflection; additionally, the metal pattern BSM can shield the bottom electrostatic field effect caused by the accumulation of electrostatic charges in the substrate to reduce the back channel caused by the electrostatic charges in the substrate on the transistor. In the first stage T1, the metal pattern BSM is powered on before the data line DATA is powered on so that the threshold voltage of the transistor can be in a negative bias state before the data line DATA is powered on, thereby offsetting at least part of the impact of the forward bias of the threshold voltage of the transistor caused by static electricity. In this manner, the situation of flickering of the display panel is improved in the process of powering on. Additionally/alternatively, in the second stage T2, the metal pattern BSM is powered off after the data line DATA is powered off so that the threshold voltage of the transistor can be in a negative bias state after the data line DATA is powered off, thereby offsetting at least part of the impact of the forward bias of the threshold voltage of the transistor caused by static electricity. In this manner, the situation of flickering of the display panel is improved in the process of powering off.

Illustratively, the metal pattern BSM may include a portion extending in the first direction X and may also include a portion extending in the second direction Y. For example, the metal pattern BSM may have a grid-like structure.

Illustratively, the display panel 100 may also include multiple insulation layers. For example, as shown in FIG. 2, the multiple insulation layers include a buffer layer buffer, a gate insulation layer GI, a capacitive insulation layer IMD, an interlayer dielectric layer ILD, a planarization layer PLN, and a pixel definition layer PDL.

It should be noted that the structure of the display panel in this embodiment of the present application may include but is not limited to the structure shown in FIG. 2.

As shown in FIG. 3, the pixel circuit 20 includes a drive transistor M3 and at least one switch transistor. The switch transistor in FIG. 3 includes transistors M1, M2, M4, M5, M6, and M7, and each transistor in FIG. 3 is illustrated as a P-type transistor. It should be noted that the structure of the pixel circuit in the present application may include but is not limited to the structure shown in FIG. 3.

In some embodiments, the metal pattern BSM may at least overlap the orthographic projection of the channel of the drive transistor M3 on the substrate 10. In the process of powering on and off, if current leakage occurs in the drive transistor M3, the light-emitting element 30 is likely to be caused to emit light. In this embodiment of the present application, however, the metal pattern BSM may at least overlap the channel of the drive transistor M3 so that the metal pattern BSM may at least be used for offsetting the influence of the forward bias of the drive transistor M3 in the process of powering on and/or powering off, thereby improving at least the current leakage of the drive transistor M3 in the process of powering on and/or powering off and thus improving the situation of flickering of the display panel.

Illustratively, the metal pattern BSM may overlap the orthographic projection of the channel of each transistor in the pixel circuit 20 on the substrate 10.

Illustratively, each transistor in the pixel circuit 20 may be a P-type transistor.

In some embodiments, the time interval between the first time t1 and the second time t2 is t12, and t12>1/F; additionally/alternatively, the time interval between the third time t3 and the fourth time t4 is t34, and t34>1/F. F is the frame refresh frequency of the display panel.

The frame refresh frequency is the change frequency of the minimum unit sub-frame for picture refresh. In the driving process of the display panel, a field synchronization signal VS may be included, and the frame refresh frequency may be equal to the refresh frequency of the field synchronization signal VS. It can be understood that 1/F is the duration of one frame, and 2/F is the duration of 2 frames.

In the embodiments of the present application, the data line DATA is started to be powered on in at least one frame after the metal pattern BSM is powered on. In this manner, it is ensured that after the signal in the powered-on metal pattern BSM is basically stable, the data line DATA is powered on. Thus, it is further ensured that the metal pattern BSM, after being powered on, offsets the bias of the threshold voltage of the transistor, thereby improving the situation of screen flickering in the process of powering on. Similarly, the metal pattern BSM is started to be powered off in at least one frame after the data line DATA is powered off. In this manner, it is ensured that after the signal in the powered-off data line DATA is basically stable, the metal pattern BSM is started to be powered off. Thus, it is further ensured that the bias of the threshold voltage of the transistor is offset after the data line DATA is powered off, thereby better improving the situation of screen flickering in the process of powering off.

In some embodiments, the time interval between the first time t1 and the second time t2 is t12, and t12≤2/F; additionally/alternatively, the time interval between the third time t3 and the fourth time t4 is t34, and t34≤2/F. F is the frame refresh frequency of the display panel.

The longer the power-on interval between the metal pattern BSM and the data line DATA is, the longer the overall time of the first stage T1 is, that is, the longer the power-on time of the display panel is. The longer the power-on time is, the more serious the problem of current leakage of the transistor is, which affects the user experience. In the embodiments of the present application, the power-on interval between the metal pattern BSM and data line DATA is no longer than 2/F, which can prevent the display panel from being powered on for too long. Similarly, the longer the power-off interval between the metal pattern BSM and the data line DATA is, the longer the overall time of the second stage T2 is, that is, the longer the power-off time of the display panel is. The longer the power-off time is, the more serious the problem of current leakage of the transistor is, which affects the user experience. In the embodiments of the present application, the power-off interval between the metal pattern BSM and data line DATA is no longer than 2/F, which can prevent the display panel from being powered off for too long. Additionally, t12≤2/F so that the continuity of the power-on timing of the metal pattern BSM and the data line DATA can be maintained; similarly, t34≤2/F so that the continuity of the power-off timing of the data line DATA and the metal pattern BSM can be maintained.

Illustratively, 1/F≤t12≤2/F, and within 1 to 2 frames after the metal pattern BSM is started to be powered on, the data line DATA starts to be powered on.

1/F≤t34≤2/F, and within 1 to 2 frames after the data line DATA is stopped to be powered on (that is, the data line DATA is started to be powered off), the metal pattern BSM is stopped to be powered on (that is, the pattern BSM is started to be powered off).

In some embodiments, the time interval between the first time and the second time is t12, the time interval between the third time and the fourth time is t34, and t12=t34. That is, the power-on interval between the metal pattern BSM and the data line DATA is equal to the power-off interval between the metal pattern BSM and the data line DATA. In this manner, the driving timing in the power-on and power-off stages can be symmetrical, and the bias adjustment of the threshold voltage of the transistor can be basically consistent. Thus, the display panel can present a substantially uniform black state in the process of powering on and off to improve the user experience.

In some embodiments, the first voltage V1 is equal to the second voltage V2, and/or the first black-state voltage vgmp1 is equal to the second black-state voltage vgmp2. In this manner, in the first stage T1 and the second stage T2, voltages provided to the metal pattern BSM are the same, which can ensure the consistency of the voltages provided to the metal pattern BSM of the display panel in the power-on and power-off stages; additionally/alternatively, in the first stage T1 and the second stage T2, black-state voltages provided to the data line DATA are the same, which can ensure the consistency of the voltages provided to the data line DATA of the display panel in the power-on and power-off stages. Thus, the driving voltage in the power-on and power-off stages can be symmetrical, and the bias adjustment of the threshold voltage of the transistor can be basically consistent. Therefore, the display panel can present a substantially uniform black state in the process of powering on and off to improve the user experience.

Illustratively, the display panel may have a uniform black-state voltage vgmp, and the first black-state voltage vgmp1 and the second black-state voltage vgmp2 may be greater than or equal to the black-state voltage vgmp. For example, the first black-state voltage vgmp1 and the second black-state voltage vgmp2 may each be equal to the black-state voltage vgmp. For another example, the first black-state voltage vgmp1 and the second black-state voltage vgmp2 may each be equal to the reference voltage AVDD of the display drive chip, and the reference voltage AVDD is greater than the black-state voltage vgmp. The voltage of at least part of the signals of the display panel may be converted according to the reference voltage AVDD.

In some embodiments, starting providing the first black-state voltage to the data line at the second time in the first stage may include starting providing the first black-state voltage vgmp1 to the data line DATA at the second time t2 in the first stage T1 for a duration t10, where 1/F≤t10≤2/F, and F is the frame refresh frequency of the display panel. Additionally/alternatively, stopping providing the second black-state voltage to the data line at the fourth time in the second stage may include stopping providing the second black-state voltage vgmp2 to the data line DATA at the fourth time t4 in the second stage T2, and the duration of providing the second black-state voltage vgmp2 to the data line DATA in the second stage T2 is t40, where 1/F≤t40≤2/F.

In this embodiment of the present application, the black-state voltage may make the display panel appear black, and in the power-on and power-off stages, the duration of providing the black-state voltage to the data line DATA may be 1 to 2 frames so that the stability of the powering on and off of the data line DATA can be ensured, and the power-on time of the data line DATA can be prevented from being excessively long in the power-on and power-off stages, thereby preventing the power-on and power-off time of the display panel from being excessively long.

In some embodiments, as shown in FIG. 3, the pixel circuit 20 is also electrically connected to a first power line PVDD. For example, a first electrode of the light emission control transistor M1 is electrically connected to the first power line PVDD, and a second electrode of the light emission control transistor M1 is electrically connected to a first electrode of the drive transistor M3. The voltage of the first power line PVDD after being powered on may be positive. When the light emission control transistor M1 is turned on, the positive voltage on the first power line PVDD may be transmitted to the first electrode of the drive transistor M3.

The first power line PVDD and the metal pattern BSM may be electrically connected to different signal terminals for power supply. In this manner, the power-on timing, power-off timing, power-on voltage, and the like of the first power line PVDD and the metal pattern BSM can be independently controlled, thereby facilitating flexible configuration of the drive timing and power-on voltage as required.

For example, as shown in FIG. 4, the voltage supply to the first power line PVDD and the voltage supply to the metal pattern BSM may be started at the same time in the first stage T1, and the voltage supply to the first power line PVDD and the voltage supply to the metal pattern BSM may be stopped at the same time in the second stage T2.

Figure 5:
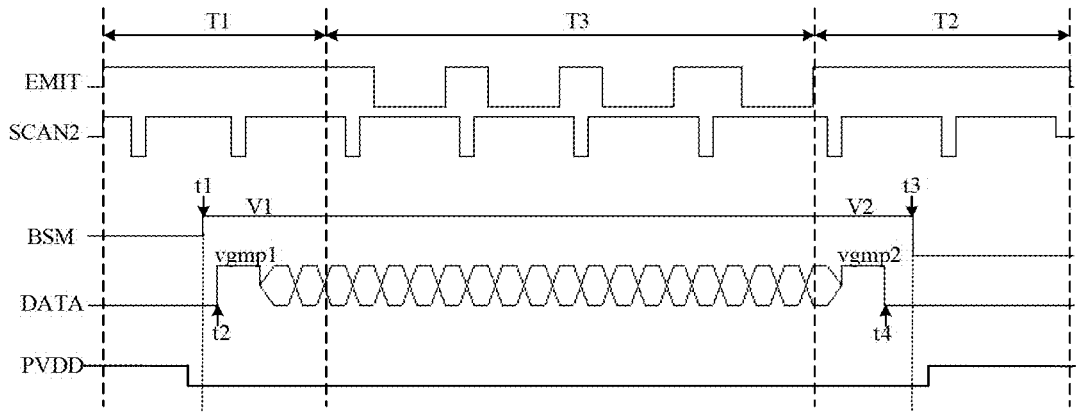
FIG. 5 is another timing diagram of the display panel according to an embodiment of the present application.

Alternatively, as shown in FIG. 5, the voltage supply to the first power line PVDD and the voltage supply to the metal pattern BSM may be started at different time in the first stage T1, and the voltage supply to the first power line PVDD and the voltage supply to the metal pattern BSM may be stopped at different time in the second stage T2.

For another example, different voltages may be provided to the first power line PVDD and the metal pattern BSM; alternatively, the same voltages may be provided to the first power line PVDD and the metal pattern BSM.

For example, in the case where the threshold voltage of the transistor is severely forward-biased, a larger voltage may be provided to the metal pattern BSM (for example, the voltage provided to the metal pattern BSM may be larger than the voltage provided to the first power line PVDD) so that the threshold voltage of the transistor can be biased negatively to a greater extent to offset the severe forward bias of the threshold voltage. Of course, this is merely an example, and this embodiment of the present application may include but is not limited to this.

In other embodiments, the first power line PVDD may be electrically connected to the metal pattern BSM. In this manner, the power-on timing, power-off timing, power-on voltage, and the like of the first power line PVDD and the metal pattern BSM can be the same, which is beneficial to simplifying the driving timing. Additionally, in the case where the first power line PVDD is electrically connected to the metal pattern BSM, the two may be electrically connected to the same signal terminal for power supply. In this manner, it is not necessary to provide multiple signal terminals for power supply, which facilitates simplification of the structure.

It can be understood that since the first power line PVDD is electrically connected to the metal pattern BSM, as shown in FIG. 4, the driving method for the display panel provided by this embodiment of the present application also includes the steps described below. At the first time t1 in the first stage T1, a first voltage V1 is started to be provided to the first power line PVDD; at the third time t3 in the second stage T2, a second voltage V2 is stopped to be provided to the first power line PVDD. The first voltage V1 and the second voltage V2 are voltages provided to the metal pattern BSM.

Illustratively, the first voltage V1 and the second voltage V2 may be approximately 4.6 V.

In some embodiments, as shown in FIG. 3, the anode of the light-emitting element 30 is electrically connected to the pixel circuit 20, and the cathode of the light-emitting element 30 is electrically connected to a second power line PVEE.

Figure 6:
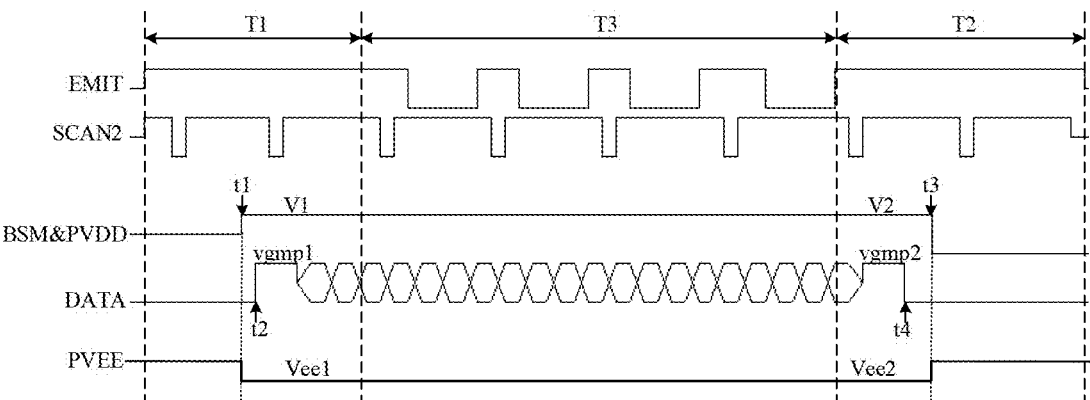
FIG. 6 is another timing diagram of the display panel according to an embodiment of the present application.

As shown in FIG. 6, the driving method for the display panel provided by this embodiment of the present application also includes the steps described below. At the first time t1 in the first stage T1, a first power voltage Vee1 is started to be provided to the second power line PVEE, and the first power voltage Vee1 is less than 0; at the third time t3 in the second stage T2, a second power voltage Vee2 is stopped to be provided to the second power line PVEE, and the second power voltage Vee2 is less than 0.

As described above, the time at which the first power line PVDD starts to be powered on is the first time t1, and the time at which the first power line PVDD stops to be powered on is the third time t3 (that is, the time at which the first power line PVDD is powered off is the third time t3). In this embodiment of the present application, the second power line PVEE and the first power line PVDD are controlled to have the same power-on time and the same power-off time, that is, the second power line PVEE and the first power line PVDD are controlled to be powered on and powered off at the same time. Thus, the control timing can be simplified.

It should be noted that the second power line PVEE and the first power line PVDD may be in a non-powered state before the voltage supply to the second power line PVEE and the first power line PVDD is started, the second power line PVEE and the first power line PVDD may be in a powered state before the voltage supply to the second power line PVEE and the first power line PVDD is stopped, and the second power line PVEE and the first power line PVDD may be in a powered-off state after the voltage supply to the second power line PVEE and the first power line PVDD is stopped.

In some embodiments, the first power voltage Vee1 may be equal to the second power voltage Vee2. In this manner, the voltages provided to the second power line PVEE are the same in the first stage T1 and the second stage T2, which can ensure the consistency of the voltages provided to the second power line PVEE of the display panel in the power-on and power-off stages. Thus, the power voltages in the power-on and power-off stages can be symmetrical, and the bias adjustment of the threshold voltage of the transistor can be basically consistent. Therefore, the display panel can present a substantially uniform black state in the process of powering on and off to improve the user experience.

Illustratively, the first power voltage Vee1 and the second power voltage Vee2 may be approximately 2.7 V.

In some embodiments, as shown in FIG. 3, the anode of the light-emitting element 30 is electrically connected to an initialization signal line Vini. Illustratively, a first electrode of the initialization transistor M7 is electrically connected to the initialization signal line Vini, and a second electrode of the initialization transistor M7 is electrically connected to the anode of the light-emitting element 30. The initialization voltage after the initialization signal line Vini is powered on may be used for initializing the anode potential of the light-emitting element 30.

Figure 7:
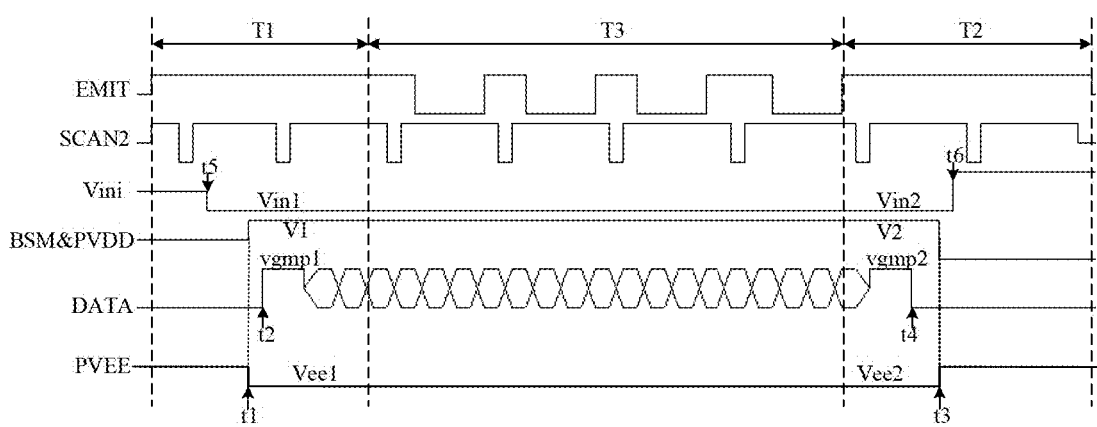
FIG. 7 is another timing diagram of the display panel according to an embodiment of the present application.

As shown in FIG. 7, the driving method for the display panel provided by this embodiment of the present application also includes the steps described below. At the fifth time t5 in the first stage T1, a first initialization voltage Vin1 is started to be provided to the initialization signal line Vini, and the first initialization voltage Vin1 is less than 0; at the sixth time t6 in the second stage T2, a second initialization signal Vin2 is stopped to be provided to the initialization signal line Vini, and the second initialization voltage Vin2 is less than 0; the fifth time t5 is before the first time t1, and/or the sixth time t6 is after the third time t3.

As described above, the second power line PVEE and the first power line PVDD may be simultaneously powered on and off, and the first power line PVDD and the metal pattern BSM may be simultaneously powered on and off. If in the first stage T1, the power-on time of the initialization signal line Vini is after the power-on time of the second power line PVEE and the power-on time of the first power PVDD, or if in the second stage T2, the power-off time of the initialization signal line Vini is before the power-off time of the second power line PVEE and the power-off time of the first power line PVDD, the cathode potential of the light-emitting element 30 is negative, and the anode potential of the light-emitting element 30 is GND potential, causing residual charges to flow in the circuit where the light-emitting element 30 is located. Therefore, the light-emitting element 30 may flicker.

In this embodiment of the present application, since the fifth time t5 is before the first time t1, and/or the sixth time t6 is after the third time t3, it is convenient to control, in the first stage T1, the power-on time of the initialization signal line Vini to be before the power-on time of the second power line PVEE and the power-on time of the first power line PVDD and/or to control, in the second stage T2, the power-off time of the initialization signal line Vini to be after the power-off time of the second power line PVEE and the power-off time of the first power line PVDD, which helps to prevent residual charges from flowing in the circuit where the light-emitting element 30 is located, thereby helping to prevent the light-emitting element 30 from flickering.

It should be noted that the initialization signal line Vini may be in a non-powered state before starting provide voltage to the initialization signal line Vini, the initialization signal line Vini may be in a powered state before stopping provide voltage to the initialization signal line Vini, and the initialization signal line Vini may be in a powered-off state after stopping provide voltage to the initialization signal line Vini.

In some embodiments, the time interval between the first time t1 and the fifth time t5 is t15, and t15>1/F; additionally/alternatively, the time interval between the third time t3 and the sixth time t6 is t36, and t36≥1/F; F is the frame refresh frequency of the display panel.

In this embodiment of the present application, the metal pattern BSM is started to be powered at least one frame after the initialization signal line Vini is powered on. In this manner, it is ensured that the power-on signal of the initialization signal line Vini is basically stable before the metal pattern BSM is powered on. Thus, the flickering of the light-emitting element is further prevented in the power-on stage. Similarly, the initialization signal line Vini is started to be powered off at least one frame after the metal pattern BSM is powered off. In this manner, it is ensured that after the powered off metal pattern BSM is basically stable, the initialization signal line Vini is powered off. Thus, the flickering of the light-emitting element is further prevented in the power-off stage.

In some embodiments, the time interval between the first time t1 and the fifth time t5 is t15, and t15≤2/F; additionally/alternatively, the time interval between the third time t3 and the sixth time t6 is t36, and t36≤2/F. F is the frame refresh frequency of the display panel.

The longer the power-on interval between the initialization signal line Vini and the metal pattern BSM is, the longer the overall time of the first stage T1 is, that is, the longer the power-on time of the display panel is. The longer the power-on time of the display panel is, the more serious the problem of current leakage of the transistor is, which affects the user experience. In this embodiment of the present application, the time interval between the power-on time of the initialization signal line Vini and the power-on time of the pattern BSM is no longer than 2/F, which can avoid the power-on duration of the display panel being too large. Similarly, the longer the time interval between the power-off time of the initialization signal line Vini and the power-off time of the metal pattern BSM is, the longer the overall time of the second stage T2 is, that is, the longer the power-off time of the display panel is. The longer the power-off time of the display panel is, the more serious the problem of current leakage of the transistor is, which affects the user experience. In this embodiment of the present application, the time interval between the power-on time of the initialization signal line Vini and the power-on time of the metal pattern BSM is no longer than 2/F, which can prevent the display panel from being powered off for too long. Additionally, t15≤2/F so that the continuity of the power-on timing of the initialization signal line Vini and the metal pattern BSM can be maintained; similarly, t36≤2/F so that the continuity of the power-off timing of the initialization signal line Vini and the metal pattern BSM can be maintained.

Illustratively, 1/F≤t15≤2/F, and within 1 to 2 frames after the initialization signal line Vini is started to be powered on, the metal pattern BSM starts to be powered on.

Illustratively, 1/F≤t36≤2/F, and within 1 to 2 frames after the metal pattern BSM is stopped to be powered on (that is, the metal pattern BSM is started to be powered off), the initialization signal line Vini is stopped to be powered on (that is, the initialization signal line Vini is started to be powered off).

In some embodiments, the interval between the first time t1 and the fifth time t5 is t15, the interval between the third time t3 and the sixth time t6 is t36, and t15=t36.

That is, the time interval between the power-on time of the metal pattern BSM and the power-on time of the initialization signal line Vini is equal to the time interval between the power-off time of the metal pattern BSM and the power-off time of the initialization signal line Vini. In this manner, the driving timing in the power-on and power-off stages can be symmetrical, and a basically consistent effect is imposed on the flickering of the light-emitting element in the power-on and power-off stages. Thus, the display panel can present a substantially uniform black state in the process of powering on and off to improve the user experience.

In some embodiments, the first initialization voltage Vin1 is equal to the second initialization voltage Vin2 so that in the first stage T1 and the second stage T2, the voltages provided to the initialization signal line Vini are the same. In this manner, the consistency of the voltages provided to the initialization signal line Vini of the display panel is ensured in the power-on and power-off stages, and a basically consistent effect is imposed on the flickering of the light-emitting element in the power-on and power-off stages. Thus, the display panel can present a substantially uniform black state in the process of powering on and off to improve the user experience.

In some embodiments, as shown in FIG. 3, the drive transistor M3 of the pixel circuit 20 may also be electrically connected to a reset signal line Vref. For example, a first electrode of the reset transistor M5 is electrically connected to the reset signal line Vref, and a second electrode of the reset transistor M5 is electrically connected to the gate of the drive transistor M3.

Figure 8:
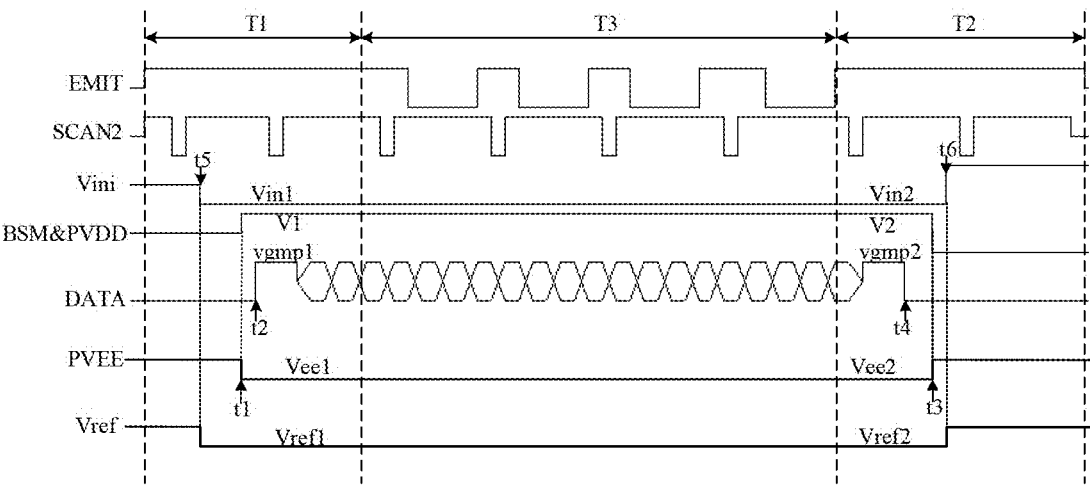
FIG. 8 is another timing diagram of the display panel according to an embodiment of the present application.

In an example, as shown in FIG. 8, the driving method for the display panel provided by this embodiment of the present application also includes the steps described below. At the fifth time t5, a first reset voltage Vref1 is started to be provided to the reset signal line Vref, and the first reset voltage Vref1 is less than 0; at the sixth time t6, a second reset voltage Vref2 is stopped to be provided to the reset signal line Vref, and the second reset voltage Vref2 is less than 0.

In this embodiment of the present application, the power-on time of the initialization signal line Vini and the power-on time of the reset signal line Vref are both at the fifth time t5, and the power-off time of the initialization signal line Vini and the power-off time of the reset signal line Vref are both at the sixth time t6. Thus, the control timing can be simplified.

Figure 9:
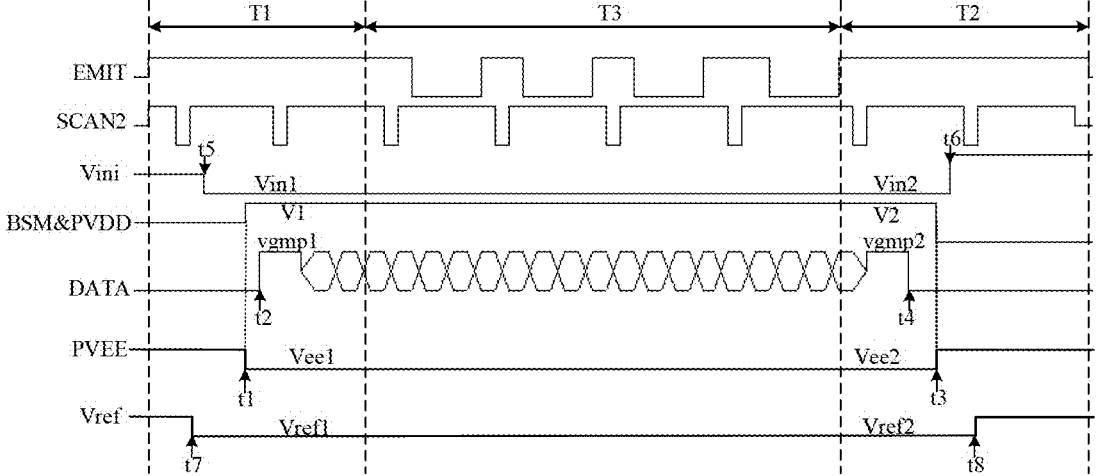
FIG. 9 is another timing diagram of the display panel according to an embodiment of the present application.

In another example, as shown in FIG. 9, at the seventh time t7 in the first stage T1, the first reset voltage Vref1 is started to be provided to the reset signal line Vref, and the first reset voltage Vref1 is less than 0; at the eighth time t8 in the second stage T2, the second reset voltage Vref2 is stopped to be provided to the reset signal line Vref, and the second reset voltage Vref2 is less than 0; the seventh time t7 and the fifth time t5 are different, and/or the eighth time t8 and the sixth time t6 are different.

In this embodiment of the present application, the power-on time of the initialization signal line Vini and the power-on time of the reset signal line Vref are different, and/or power-off time of the initialization signal line Vini and the power-off time of the reset signal line Vref are different so that the power-on and off timing of the reset signal line Vref and the initialization signal line Vini can be flexibly controlled as required.

It should be noted that the reset signal line Vref may be in a non-powered state before the voltage supply to the reset signal line Vref is started, the reset signal line Vref may be in a powered state before the voltage supply to the reset signal line Vref is stopped, and the reset signal line Vref may be in a powered-off state after the voltage supply to the reset signal line Vref is stopped.

In some embodiments, the first reset voltage Vref1 is equal to the second reset voltage Vref2 so that in the first stage T1 and the second stage T2, the voltages provided to reset signal line Vref are the same. In this manner, it is ensured that the voltages provided to the reset signal line Vref of the display panel in the power-on and power-off stages are consistent, and the gate reset of the drive transistor M3 can have a basically consistent effect in the power-on and power-off stages. Thus, the display panel can present a substantially uniform black state in the process of powering on and off to improve the user experience.

In some embodiments, the reset voltage provided to the reset signal line Vref may not be equal to the initialization voltage provided to the initialization signal line Vini. For example, the first reset voltage Vref1 is not equal to the first initialization voltage Vin1, and the second reset voltage Vref2 is not equal to the second initialization voltage Vin2.

Figure 10:
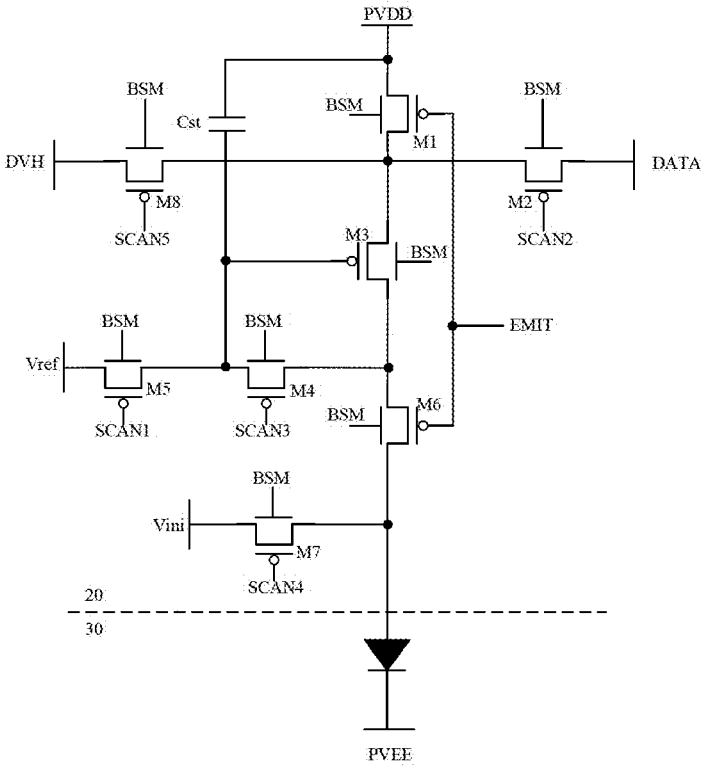
FIG. 10 is a schematic diagram illustrating another circuit structure of a pixel circuit in the display panel according to an embodiment of the present application.

In some embodiments, as shown in FIG. 10, the drive transistor M3 of the pixel circuit 20 may also be electrically connected to a bias adjustment signal line DVH. For example, the pixel circuit 20 may also include a bias adjustment transistor M8, a first electrode of the bias adjustment transistor M8 is electrically connected to the bias adjustment signal line DVH, and a second electrode of the bias adjustment transistor M8 is electrically connected to the first electrode of the drive transistor M3.

Figure 11:
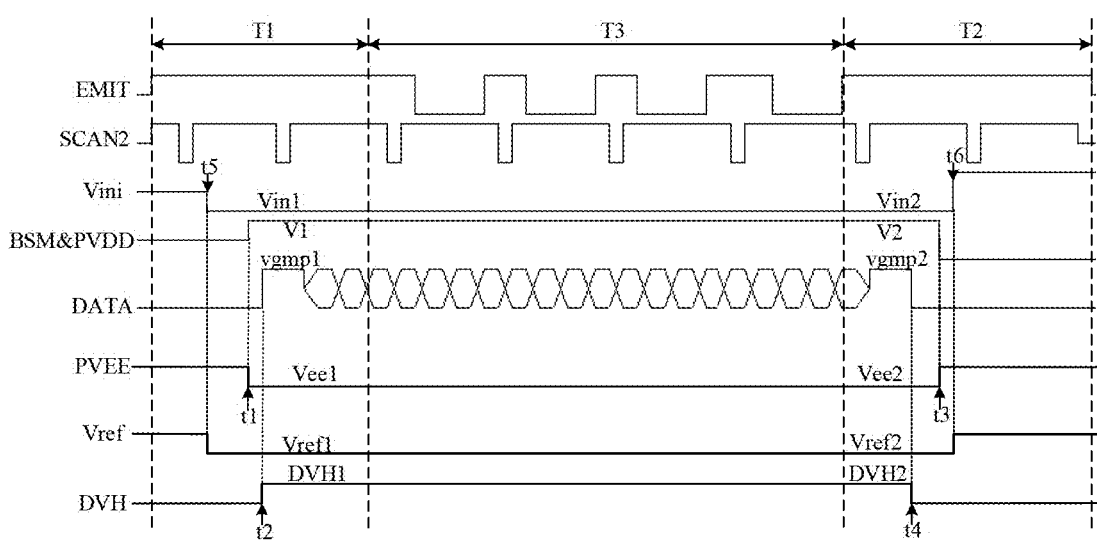
FIG. 11 is another timing diagram of the display panel according to an embodiment of the present application.

As shown in FIG. 11, the driving method provided by this embodiment of the present application also includes the steps described below. At the second time t2 in the first stage T1, a first bias adjustment voltage DVH1 is started to be provided to the bias adjustment signal line DVH; at the fourth time t4 in the second stage T2, a second bias adjustment voltage DVH1 is stopped to be provided to the bias adjustment signal line DVH. In this manner, the power-on timing and power-off timing of the bias adjustment signal line DVH and the data line DATA can be the same, which is beneficial to simplifying the driving timing.

It can be understood that if the bias adjustment signal line DVH is powered on before the metal pattern BSM, or if the bias adjustment signal line DVH is powered off after the metal pattern BSM, the higher bias adjustment voltage on the bias adjustment signal line DVH easily flows into the light-emitting element 30, causing the light-emitting element 30 to emit light. As a result, screen flickering is likely to occur in the process of powering on and off of the display panel. In this embodiment of the present application, the metal pattern BSM is powered on before the bias adjustment signal line DVH is powered on in the first stage T1 so that the threshold voltage of the transistor can be in a negative bias state before the bias adjustment signal line DVH is powered on, thereby offsetting at least part of the impact of the forward bias of the threshold voltage of the transistor caused by static electricity. In this manner, the situation of flickering of the display panel is improved in the process of powering on. Additionally/alternatively, the metal pattern BSM is powered off after the bias adjustment signal line DVH is powered off in the second stage T2 so that the threshold voltage of the transistor can be in a negative bias state after the bias adjustment signal line DVH is powered off, thereby offsetting at least part of the impact of the forward bias of the threshold voltage of the transistor caused by static electricity. In this manner, the situation of flickering of the display panel is improved in the process of powering off. In the case where the bias adjustment transistor M8 is turned on, the first bias adjustment voltage DVH1 or the second bias adjustment voltage DVH2 may be transmitted to the first electrode of the drive transistor M3, and the first bias adjustment voltage DVH1 and the second bias adjustment voltage DVH2 may be used for adjusting the bias state of the drive transistor M3.

Illustratively, the first bias adjustment voltage DVH1 is greater than 0, and the second bias adjustment voltage DVH2 is greater than 0.

Illustratively, the first bias adjustment voltage DVH1 is equal to the second bias adjustment voltage DVH2, so that in the first stage T1 and the second stage T2, the voltages provided to the bias adjustment signal line DVH are the same, which can facilitate the adjustment of the bias state of the drive transistor M3 of the display panel to be consistent in the power-on and power-off stages. Thus, the display panel can present a substantially uniform black state in the process of powering on and off to improve the user experience.

In some embodiments, as shown in FIG. 3 or FIG. 10, the pixel circuit 20 is also electrically connected to a light emission control signal line EMIT. For example, the gates of the light emission control transistors M1 and M6 of the pixel circuit 20 are electrically connected to the light emission control signal line EMIT, a first electrode of the light emission control transistor M1 is electrically connected to the first power line PVDD, a second electrode of the light emission control transistor M1 is electrically connected to the first electrode of the drive transistor M3, a first electrode of the light emission control transistor M6 is electrically connected to the second electrode of the drive transistor M3, and a second electrode of the light emission control transistor M6 is electrically connected to the anode of the light-emitting element 30.

As shown in FIG. 4, the driving method for the display panel provided by this embodiment of the present application also includes the steps described below. In the first stage T1 and the second stage T2, a light-emitting non-enable voltage VGH is provided to the light emission control signal line EMIT; in the display stage T3, alternating light-emitting non-enable voltage VGH and light-emitting enable voltage VGL are provided to the light emission control signal line EMIT.

The light-emitting non-enable voltage VGH is a voltage for controlling the light emission control transistors M1 and M6 to be turned off. The light-emitting enable voltage VGL is a voltage for controlling the light emission control transistors M1 and M6 to be turned on. In the first stage T1 and the second stage T2, the light-emitting non-enable voltage VGH on the light emission control signal line EMIT may control the light emission control transistors M1 and M6 to be turned off. Thus, the leakage current of the data line DATA, for example, can be prevented from flowing to the light-emitting element 30, thereby further improving the situation of flickering in the power-on and power-off stages.

In the display stage T3, the alternating light-emitting non-enable voltage VGH and light-emitting enable voltage VGL on the light emission control signal line EMIT can control the light emission control transistors M1 and M6 to be alternately turned on and off. In this manner, the light-emitting element 30 can be controlled to alternately perform the light-emitting stage and the non-light-emitting stage.

Illustratively, as shown in FIG. 1, the display panel 100 also includes multiple emission shift circuits 40 arranged in cascade; an emission shift circuit 40 is electrically connected to the light emission control signal line EMIT, the emission shift circuit 40 includes a first emission shift circuit 41, and the first emission shift circuit 41 is electrically connected to the emission frame start signal line STV_E.

Illustratively, providing the light-emitting non-enable voltage VGH to the light emission control signal line EMIT in the first stage T1 and the second stage T2 may include the step described below. In the first stage T1 and the second stage T2, the light-emitting non-enable voltage VGH is provided to the emission frame start signal line STV_E to control the emission shift circuit 40 to provide the light-emitting non-enable voltage VGH to the light emission control signal line EMIT.

In the display stage T3, providing the alternating light-emitting non-enable voltage VGH and the light-emitting enable voltage VGL to the light emission control signal line EMIT may include the step described below. In the display stage T3, the alternating light-emitting non-enable voltage VGH and light-emitting enable voltage VGL are provided to the emission frame start signal line STV_E to control the emission shift circuit 40 to provide the alternating light-emitting non-enable voltage VGH and light-emitting enable voltage VGL to the light emission control signal line EMIT.

Figure 12:
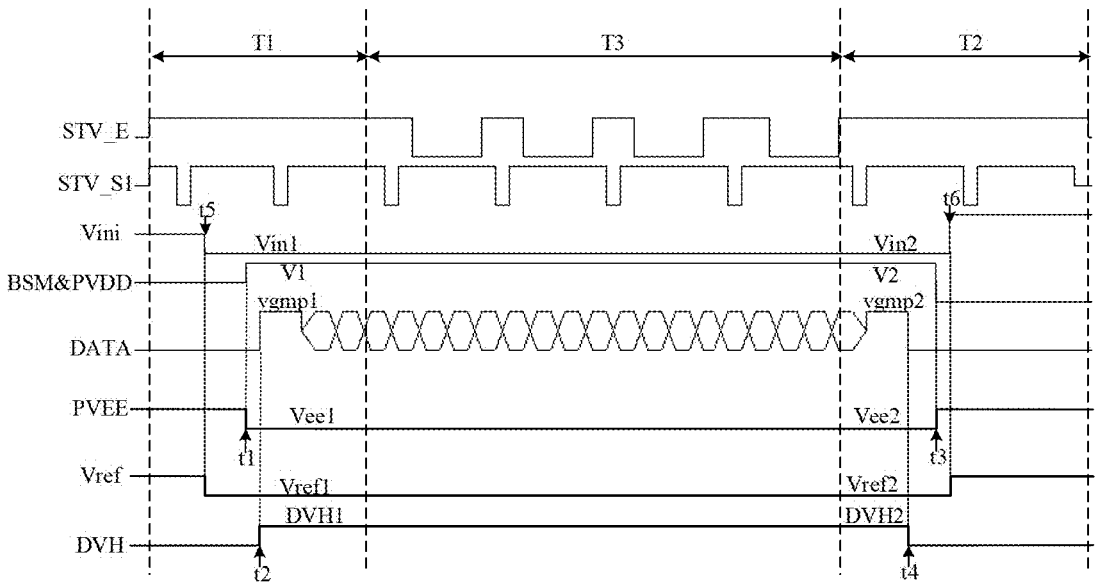
FIG. 12 is another timing diagram of the display panel according to an embodiment of the present application.

Illustratively, as shown in FIG. 1, the emission shift circuits 40 are separately electrically connected to a first emission clock signal line CK1_E and a second emission clock signal line CK2_E. As shown in FIG. 12, the driving method for the display panel provided by this embodiment of the present application may also include the step described below. In the first stage T1, the second stage T2 and the display stage T3, a normal pulse signal is provided to the first emission clock signal line CK1_E and the second emission clock signal line CK2_E.

In some embodiments, as shown in FIG. 1, the pixel circuit 20 is also electrically connected to a scan line SCAN. For example, as shown in FIG. 3, the gate of the reset transistor M5 of the pixel circuit 20 is electrically connected to a first scan line SCAN1, the gate of the data writing transistor M2 of the pixel circuit 20 is electrically connected to a second scan line SCAN2, the gate of the threshold compensation transistor M4 is electrically connected to a third scan line SCAN3, and the gate of the initialization transistor M7 is electrically connected to a fourth scan line SCAN4. For another example, as shown in FIG. 10, the gate of the bias adjustment transistor M8 is electrically connected to a fifth scan line SCAN5.

As shown in FIG. 4, the driving method for the display panel provided by this embodiment of the present application also includes the step described below. An enable voltage is provided to the scan line SCAN during at least a portion of time periods of the first stage T1 and the second stage T2.

Illustratively, the driving method for the display panel provided by this embodiment of the present application also includes the step described below. In the first stage T1, the second stage T2, and the display stage, a normal pulse signal is provided to the scan line SCAN.

In the first stage T1 and the second stage T2, the switch transistor controlled by the scan line in the pixel circuit can be turned on normally so that the reset voltage on the reset signal line can be written into the gate of the drive transistor; then the gate of the drive transistor is reset, the black-state voltage on the data line can be written into the gate of the drive transistor, and the threshold compensation transistor can compensate the threshold voltage of the drive transistor; the initialization voltage on the initialization signal line can be written into the anode of the light-emitting element, thereby initializing the anode potential of the light-emitting element. Since the light emission control transistors M1 and M6 are turned off in the first stage T1 and the second stage T2, the situation of screen flickering can be somewhat improved even if the scan line normally drives the pixel circuit in the first stage T1 and the second stage T2.

In some embodiments, with reference to FIG. 1, the display panel also includes multiple first scan shift circuits 50 arranged in cascade, and first scan shift circuits 50 are separately electrically connected to a first A scan clock signal line CK1_S1, a first B scan clock signal line CK2_S1, and the scan signal line SCAN (for example, each scan line in FIG. 3). The first scan shift circuit 50 includes a first A scan shift circuit 51. The first A scan shift circuit 51 is also electrically connected to a first A scan frame start signal line STV_S1.

As shown in FIG. 12, the driving method for the display panel provided by this embodiment of the present application may also include the steps described below. In the first stage T1, the second stage T2, and the display stage T3, pulse signals are provided to the first A scan clock signal line CK1_S1, the first B scan clock signal line CK2_S1, and the first A scan frame start signal line STV_S1. Thus, the first scan shift circuit 50 operates normally in the first stage T1, the second stage T2, and the display stage T3 so that the scan line connected to the first scan shift circuit 50 can refresh the pixel circuit normally.

Figure 13:
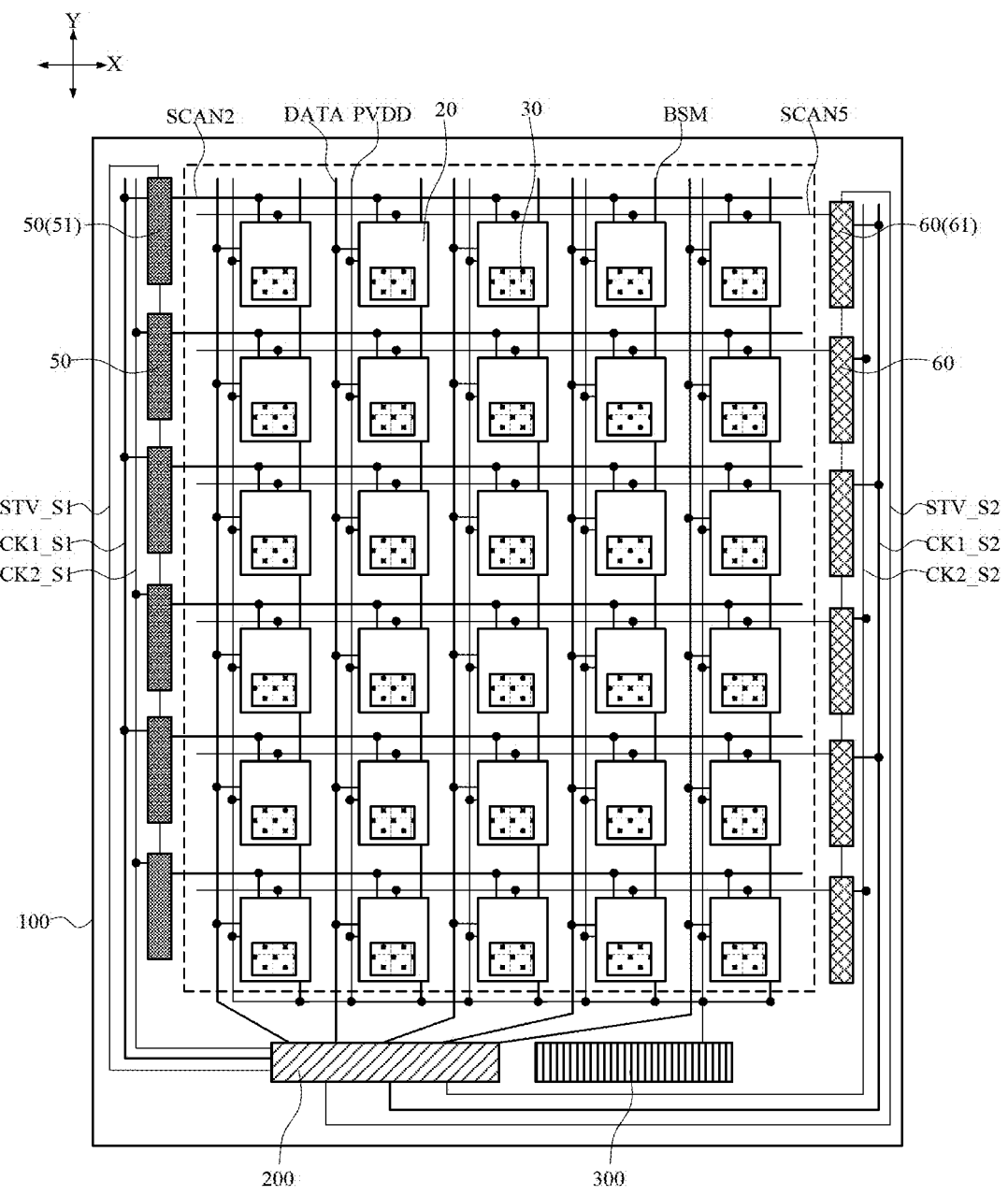
FIG. 13 is a top view illustrating another structure of a display device according to an embodiment of the present application.

In some other embodiments, as shown in FIG. 10, the pixel circuit 20 may also include a bias adjustment transistor M8. Correspondingly, as shown in FIG. 13, the display panel 100 also includes multiple second scan shift circuits 60 arranged in cascade; the second scan shift circuits 60 are separately electrically connected to the second A scan clock signal line CK1_S2, the second B scan clock signal line CK2_S2, and the fifth scan signal line SCAN5. The second scan shift circuit 60 includes a second A scan shift circuit 61. The second A scan shift circuit 61 is also electrically connected to a second scan frame start signal line STV_S2.

Figure 14:
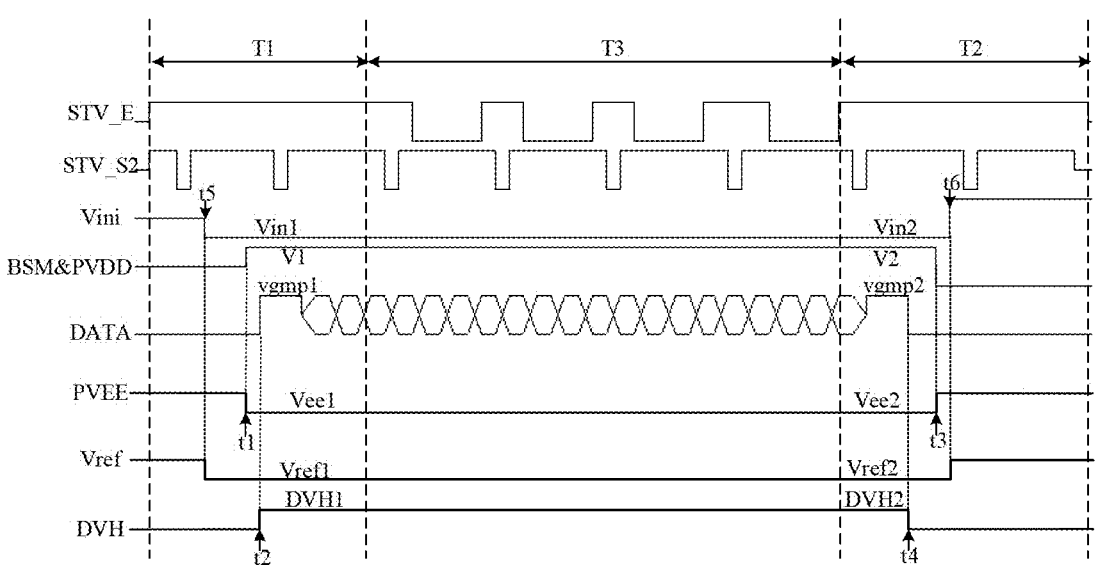
FIG. 14 is another timing diagram of the display panel according to an embodiment of the present application.

As shown in FIG. 14, the driving method for the display panel provided by this embodiment of the present application may also include the steps described below. In the first stage T1, the second stage T2, and the display stage T3, pulse signals are provided to the second A scan clock signal line CK1_S2, the second B scan clock signal line CK2_S2, and the second scan frame start signal line STV_S2. Thus, the second scan shift circuit 60 operates normally in the first stage T1, the second stage T2, and the display stage T3 so that the scan line connected to the second scan shift circuit 60 can refresh the pixel circuit normally.

In some example embodiments, as shown in FIG. 3 and FIG. 10, the reset transistor M5 and the threshold compensation transistor M4 may both be P-type transistors.

Figure 15:
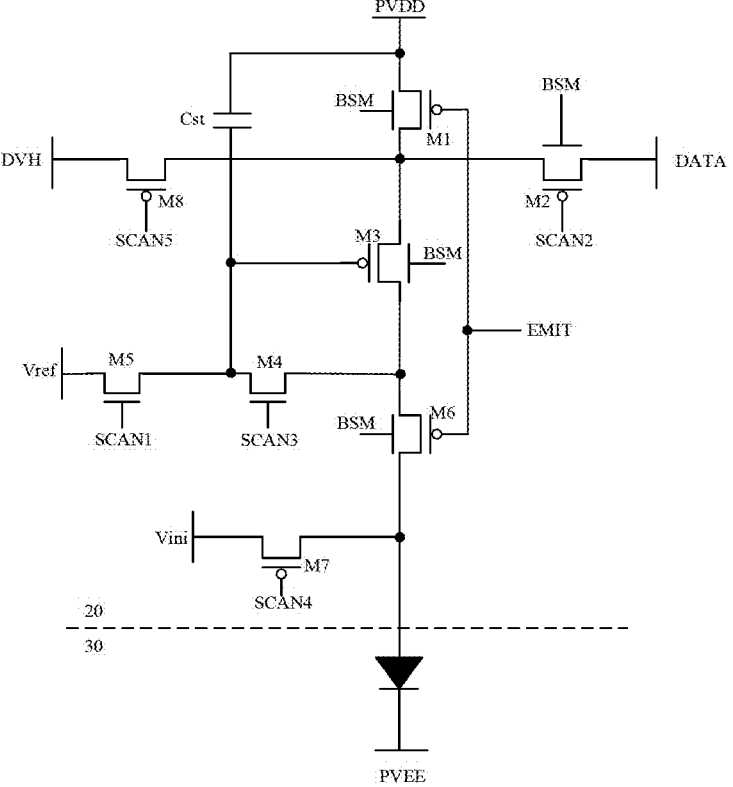
FIG. 15 is a schematic diagram illustrating another circuit structure of a pixel circuit in a display panel according to an embodiment of the present application.

In other embodiments, as shown in FIG. 15, the reset transistor M5 and the threshold compensation transistor M4 may both be N-type transistors, such as Indium Gallium Zinc Oxide (IGZO) transistors.

For a P-type transistor, its turn-on level is low level, and its cutoff level is high level. For an N-type transistor, its turn-on level is high level, and its cutoff level is low level.

It should be noted that the present application does not limit the working timing of the pixel circuit 20. For example, the working timing of the pixel circuit 20 in this embodiment of the present application includes but is not limited to a reset stage, a data writing stage, and a light-emitting stage. In the reset stage and the data writing stage, the light emission control transistors M1 and M6 are turned off. In the reset stage, the reset transistor M5 is turned on, and the signal on the reset signal line Vref is transmitted to the gate of the drive transistor M3 to reset the gate of the drive transistor M3. In the data writing stage, the data writing transistor M2 and the threshold compensation transistor M4 are turned on, the signal on the data line DATA is written into the gate of the drive transistor M3, and the threshold compensation transistor M4 performs threshold compensation on the drive transistor M3. Additionally, the initialization transistor M7 may be turned on in the data writing stage, and the signal on the initialization signal line Vini is transmitted to the anode of the light-emitting element 30. In the light-emitting stage, the light emission control transistors M1 and M6 are turned on.

In the case where the pixel circuit 20 also includes a bias adjustment transistor M8, the working timing of the pixel circuit 20 in this embodiment of the present application may also include a bias adjustment stage; in the bias adjustment stage, the light emission control transistors M1 and M6 are turned off, the bias adjustment transistor M8 is turned on, and the signal on the bias adjustment signal line DVH is transmitted to the drive transistor M3.

It should be noted that in the first stage T1 and the second stage T2, the working timing of the pixel circuit 20 may not include a light-emitting stage; in the display stage T3, the working timing of the pixel circuit 20 includes a light-emitting stage.

It should also be noted that in FIG. 1, an example is used for illustration where one side of the display panel is provided with emission shift circuits 40, the other side of the display panel is provided with first scan shift circuits 50; in FIG. 13, an example is used for illustration where one side of the display panel is provided with second scan shift circuits 60, and the other side of the display panel is provided with first scan shift circuits 50. The arrangement of the shift circuit of the display panel provided by the present application may include but is not limited to, the examples shown in FIG. 1 or FIG. 13.

For example, in some examples, the emission shift circuits 40 may be disposed on both sides of the display panel; the first scan shift circuits 50 may also be disposed on both sides of the display panel; the second scan shift circuits 60 may also be disposed on both sides of the display panel.

Although not shown in FIG. 13, the emission shift circuit 40 may be included in the corresponding embodiments of FIG. 13.

Based on the same inventive concept, this embodiment of the present application also provides a display device. As shown in FIGS. 1 to 4, the display device includes a display panel 100, a display drive chip 200, and a power drive chip 300. The display panel 100 includes a substrate 10, metal patterns BSM, pixel circuits 20, and light-emitting elements 30.

In the direction Z of the thickness of the display panel 100, the metal pattern BSM is disposed between the substrate 10 and the pixel circuit 20, and the metal pattern BSM overlaps the orthographic projection of a channel of at least a portion of transistors in the pixel circuit 20 on the substrate 10.

The driving process of the display panel 100 includes a first stage T1, a display stage T3, and a second stage T2, and the display stage T3 is between the first stage T1 and the second stage T2.

The power drive chip 300 is configured to start providing a first voltage V1 to the metal pattern BSM at the first time t1 in the first stage T1 and stop providing a second voltage V2 to the metal pattern BSM at the third time in the second stage T2; the first voltage V1 is greater than 0, and the second voltage V2 is greater than 0.

The display drive chip 200 is configured to start providing a first black-state voltage vgmp1 to the data line DATA at the second time t2 in the first stage T1 and stop providing a second black-state voltage vgmp2 to the data line DATA at the fourth time t4 in the second stage T2. The first time t1 is before the second time t2, and/or the third time t3 is after the fourth time t4.

In embodiments of the present application, for a transistor that overlaps the metal pattern BSM, the metal pattern BSM can block the bottom reflection and shield the bottom electrostatic field effect caused by the accumulation of electrostatic charges. Moreover, in the first stage T1, the metal pattern BSM is powered on before the data line DATA so that the threshold voltage of the transistor can be in a negative bias state before the data line DATA is powered on, thereby offsetting at least part of the impact of the forward bias of the threshold voltage of the transistor caused by static electricity. In this manner, the situation of flickering of the display panel is improved in the process of powering on. Additionally/alternatively, in the second stage T2, the metal pattern BSM is powered off after the data line DATA so that the threshold voltage of the transistor can be in a negative bias state after the data line DATA is powered off, thereby offsetting at least part of the impact of the forward bias of the threshold voltage of the transistor caused by static electricity. In this manner, the situation of flickering of the display panel is improved in the process of powering off.

In some embodiments, the anode of the light-emitting element is electrically connected to an initialization signal line.

The power drive chip is also configured to start providing a first initialization voltage to the initialization signal line at the fifth time in the first stage and stop providing a second initialization signal to the initialization signal line at the sixth time in the second stage; the first initialization voltage is less than 0, and the second initialization voltage is less than 0.

The fifth time is before the first time, and/or the sixth time is after the third time.

In some embodiments, the time interval between the first time and the second time is t12, and t12≥1/F; additionally/ alternatively, the time interval between the third time and the fourth time is t34, and t34>1/F; F is the frame refresh frequency of the display panel.

In some embodiments, the time interval between the first time and the second time is t12, and t12≤2/F; additionally/ alternatively, the time interval between the third time and the fourth time is t34, and t34≤2/F; F is the frame refresh frequency of the display panel.

In some embodiments, the time interval between the first time and the second time is t12, the time interval between the third time and the fourth time is t34, and t12=t34.

In some embodiments, the time interval between the first time and the fifth time is t15, and t15≥1/F; additionally/ alternatively, the time interval between the third time and the sixth time is t36, and t36>1/F; F is the frame refresh frequency of the display panel.

In some embodiments, the time interval between the first time and the fifth time is t15, and t15≤2/F; additionally/ alternatively, the time interval between the third time and the sixth time is t36, and t36≤2/F; F is the frame refresh frequency of the display panel.

In some embodiments, the time interval between the first time and the fifth time is t15, the time interval between the third time and the sixth time is t36, and t15=t36.

In some embodiments, the first voltage is equal to the second voltage, and/or the first black-state voltage is equal to the second black-state voltage.

In some embodiments, the display drive chip is configured to start providing the first black-state voltage to the data line at the second time in the first stage for a duration t10, where 1/F≤t10≤2/F, and F is the frame refresh frequency of the display panel; and/or stop providing the second black-state voltage to the data line at the fourth time in the second stage, where the duration of providing the second black-state voltage to the data line in the second stage is t40, and 1/F≤t40≤2/F.

In some embodiments, the pixel circuit includes a drive transistor and at least one switch transistor, and the metal pattern at least overlaps the orthographic projection of the channel of the drive transistor on the substrate.

In some embodiments, the pixel circuit is also electrically connected to a first power line, and the first power line and the metal pattern are electrically connected to different signal terminals.

In some embodiments, the pixel circuit is also electrically connected to the first power line, and the first power line is electrically connected to the metal pattern.

In some embodiments, the light-emitting element is also electrically connected to a second power line.

The power drive chip is also configured to start providing a first power voltage to the second power line at the first time and stop providing a second power voltage to the second power line at the third time; the first power voltage is less than 0, and the second power voltage is less than 0.

In some embodiments, the first power voltage is equal to the second power voltage.

In some embodiments, the drive transistor of the pixel circuit is electrically connected to a reset signal line.

The power drive chip is also configured to start providing a first reset voltage to the reset signal line at the fifth time and stop providing a second reset signal to the reset signal line at the sixth time; the first reset voltage is less than 0, and the second reset voltage is less than 0.

Alternatively, the power drive chip is also configured to start providing a first reset voltage to the reset signal line at the seventh time in the first stage and stop providing a second reset voltage to the reset signal line at the eighth time in the second stage; the first reset voltage is less than 0, and the second reset voltage is less than 0; the seventh time and the fifth time are different, and/or the eighth time and the sixth time are different.

In some embodiments, the drive transistor of the pixel circuit is electrically connected to a bias adjustment signal line.

The power drive chip is also configured to start providing a first bias adjustment voltage to the bias adjustment signal line at the second time in the first stage and stop providing a second bias adjustment voltage to the bias adjustment signal line at the fourth time in the second stage.

In some embodiments, the pixel circuit is also electrically connected to a light emission control signal line; the display drive chip is also configured to provide a light-emitting non-enable voltage to the light emission control signal line in the first stage and the second stage and provide alternating light-emitting non-enable voltage and light-emitting enable voltage to the light emission control signal line in the display stage.

In some embodiments, the pixel circuit is also electrically connected to a scan line; the display drive chip is also configured to provide an enable voltage to the scan line during at least a portion of time periods of the first stage and the second stage.

In accordance with the preceding embodiments of the present application, these embodiments are not intended to be exhaustive or to limit the application to the specific embodiments described. Obviously, many modifications and variations are possible in light of the preceding description. These embodiments have been chosen and described in detail herein to better explain the principles and practical application of the present application and to enable those skilled in the art to make good use of the present application and modifications based on the present application. This application is limited only by the claims, the full scope thereof, and equivalents.

What is claimed is:

1. A driving method for a display panel, wherein the display panel comprises a substrate, a metal pattern, a pixel circuit, and a light-emitting element; in a thickness direction of the display panel, the metal pattern is disposed between the substrate and the pixel circuit, the metal pattern overlaps an orthographic projection of a channel of at least a portion of transistors in the pixel circuit on the substrate, and the pixel circuit is electrically connected to a data line;

a driving process of the display panel comprises a first stage, a display stage, and a second stage, and the display stage is between the first stage and the second stage; and the driving method comprises:

starting providing a first voltage to the metal pattern at first time in the first stage, wherein the first voltage is greater than 0;

starting providing a first black-state voltage to the data line at second time in the first stage;

stopping providing a second voltage to the metal pattern at third time in the second stage, wherein the second voltage is greater than 0; and stopping providing a second black-state voltage to the data line at fourth time in the second stage;

wherein at least one of following configurations is satisfied: the first time is before the second time, and the third time is after the fourth time.

2. The driving method for the display panel of claim 1, wherein an anode of the light-emitting element is electrically connected to an initialization signal line; and the driving method further comprises:

starting providing a first initialization voltage to the initialization signal line at fifth time in the first stage, wherein the first initialization voltage is less than 0; and stopping providing a second initialization signal to the initialization signal line at sixth time in the second stage, wherein the second initialization voltage is less than 0;

wherein the fifth time is before the first time, and/or the sixth time is after the third time.

3. The driving method for the display panel of claim 1, wherein a time interval between the first time and the second time is t12, and t12≥1/F; and/or a time interval between the third time and the fourth time is t34, and t34≥1/F;

wherein F is frame refresh frequency of the display panel.

4. The driving method for the display panel of claim 1, wherein a time interval between the first time and the second time is t12, and t12 ≤2/F; and/or a time interval between the third time and the fourth time is t34, and t34 ≤2/F;

wherein F is frame refresh frequency of the display panel.

5. The driving method for the display panel of claim 1, wherein a time interval between the first time and the second time is t12, a time interval between the third time and the fourth time is t34, and t12=t34.

6. The driving method for the display panel of claim 2, wherein a time interval between the first time and the fifth time is t15, and t15≥1/F; and/or a time interval between the third time and the sixth time is t36, and t36≥1/F;

wherein F is frame refresh frequency of the display panel.

7. The driving method for the display panel of claim 2, wherein a time interval between the first time and the fifth time is t15, and t15≤2/F; and/or a time interval between the third time and the sixth time is t36, and t36≤2/F;

wherein F is frame refresh frequency of the display panel.

8. The driving method for the display panel of claim 2, wherein a time interval between the first time and the fifth time is t15, a time interval between the third time and the sixth time is t36, and t15=t36.

9. The driving method for the display panel of claim 1, wherein the first voltage is equal to the second voltage, and/or the first black-state voltage is equal to the second black-state voltage.

10. The driving method for the display panel of claim 1, wherein starting providing the first black-state voltage to the data line at the second time in the first stage comprises:

starting providing the first black-state voltage to the data line at the second time in the first stage for a duration t10, wherein 1/F≤t10≤2/F, and F is frame refresh frequency of the display panel; and/or wherein stopping providing the second black-state voltage to the data line at the fourth time in the second stage comprises:

stopping providing the second black-state voltage to the data line at the fourth time in the second stage, wherein a duration of providing the second black-state voltage to the data line in the second stage is t40, wherein 1/F≤t40≤2/F.

11. The driving method for the display panel of claim 1, wherein the pixel circuit comprises a drive transistor and at least one switch transistor, and the metal pattern overlaps at least an orthographic projection of a channel of the drive transistor on the substrate.

12. The driving method for the display panel of claim 1, wherein the pixel circuit is further electrically connected to a first power line, and the first power line and the metal pattern are electrically connected to different signal terminals; and/or wherein the pixel circuit is further electrically connected to the first power line, and the first power line is electrically connected to the metal pattern.

13. The driving method for the display panel of claim 12, wherein the light-emitting element is further electrically connected to a second power line; and the driving method comprises:

starting providing a first power voltage to the second power line at the first time, wherein the first power voltage is less than 0; and stopping providing a second power voltage to the second power line at the third time, wherein the second power voltage is less than 0.

14. The driving method for the display panel of claim 13, wherein the first power voltage is equal to the second power voltage.

15. The driving method for the display panel of claim 2, wherein a drive transistor of the pixel circuit is electrically connected to a reset signal line; and the driving method further comprises:

starting providing a first reset voltage to the reset signal line at the fifth time, wherein the first reset voltage is less than 0; and stopping providing a second reset voltage to the reset signal line at the sixth time, wherein the second reset voltage is less than 0;

or the driving method further comprises:

starting providing the first reset voltage to the reset signal line at seventh time in the first stage, wherein the first reset voltage is less than 0; and stopping providing the second reset voltage to the reset signal line at eighth time in the second stage, wherein the second reset voltage is less than 0;

wherein the seventh time and the fifth time are different, and/or the eighth time and the sixth time are different.

16. The driving method for the display panel of claim 1, wherein a drive transistor of the pixel circuit is electrically connected to a bias adjustment signal line; and the driving method further comprises:

starting providing a first bias adjustment voltage to the bias adjustment signal line at the second time in the first stage; and stopping providing a second bias adjustment voltage to the bias adjustment signal line at the fourth time in the second stage.

17. The driving method for the display panel of claim 1, wherein the pixel circuit is further electrically connected to a light emission control signal line; and the driving method further comprises:

providing a light-emitting non-enable voltage to the light emission control signal line in the first stage and the second stage; and providing alternating light-emitting non-enable voltage and light-emitting enable voltage to the light emission control signal line in the display stage.

18. The driving method for the display panel of claim 1, wherein the pixel circuit is further electrically connected to a scan line; and the driving method further comprises:

providing an enable voltage to the scan line during at least a portion of time periods of the first stage and the second stage.

19. A display device, comprising:

a display panel, which comprises a substrate, a metal pattern, a pixel circuit, and a light-emitting element; wherein in a thickness direction of the display panel, the metal pattern is disposed between the substrate and the pixel circuit, the metal pattern overlaps an orthographic projection of a channel of at least a portion of transistors in the pixel circuit on the substrate, and the pixel circuit is electrically connected to a data line; and a driving process of the display panel comprises a first stage, a display stage, and a second stage, and the display stage is between the first stage and the second stage;

a power drive chip configured to start providing a first voltage to the metal pattern at first time in the first stage and stop providing a second voltage to the metal pattern at third time in the second stage, wherein the first voltage is greater than 0, and the second voltage is greater than 0; and a display drive chip configured to start providing a first black-state voltage to the data line at second time in the first stage and stop providing a second black-state voltage to the data line at fourth time in the second stage;

wherein at least one of following configurations is satisfied: the first time is before the second time, and the third time is after the fourth time.

20. The display device of claim 19, wherein an anode of the light-emitting element is electrically connected to an initialization signal line; and the power drive chip is further configured to start providing a first initialization voltage to the initialization signal line at fifth time in the first stage and stop providing a second initialization signal to the initialization signal line at sixth time in the second stage, wherein the first initialization voltage is less than 0, and the second initialization voltage is less than 0;

wherein the fifth time is before the first time, and/or the sixth time is after the third time.

* * * * *